United States Patent [19]

Taguwa

[11] Patent Number: 6,020,254
[45] Date of Patent: Feb. 1, 2000

[54] METHOD OF FABRICATING SEMICONDUCTOR DEVICES WITH CONTACT HOLES

[75] Inventor: Tetsuya Taguwa, Tokyo, Japan

[73] Assignee: NEC Corporation, Tokyo, Japan

[21] Appl. No.: 08/754,623

[22] Filed: Nov. 21, 1996

[30] Foreign Application Priority Data

Nov. 22, 1995 [JP] Japan ..................................... 7-304794

[51] Int. Cl.⁷ .................................................. H01L 21/44
[52] U.S. Cl. ........................... 438/618; 438/798; 438/906
[58] Field of Search .................................... 438/618, 798, 438/906, 680

[56] References Cited

U.S. PATENT DOCUMENTS 4,517,225  5/1985  Broadbent .
5,620,559  4/1997  Kikuchi .

FOREIGN PATENT DOCUMENTS

| 64-41218 | 2/1989 | Japan . |
| 64-51620 | 2/1989 | Japan . |
| 3-53532 | 3/1991 | Japan . |
| 4-3419 | 1/1992 | Japan . |
| 4-286115 | 10/1992 | Japan . |
| 6-53165 | 2/1994 | Japan . |
| 6-132404 | 5/1994 | Japan . |
| 6-236883 | 8/1994 | Japan . |
| 6-260444 | 9/1994 | Japan . |
| 7-99178 | 4/1995 | Japan . |
| 7-169834 | 7/1995 | Japan . |

OTHER PUBLICATIONS

Y. Harada et al., "Electrical Contact Resistance in ECRCVD–TiN/Si Structure", Technical Report of IEICE, SDM92–103, Nov. 1992, pp. 61–66.

I. Park et al., "The evaluation of in–situ contact cleaning using Ar ECR plasma for low contact resistance at deep sub–micron contact holes", Extended Abstracts (The 42nd Spring Meeting, 1995); The Japan Society of Applied Physics and Related Societies, p. 736.

*Primary Examiner*—Caridad Everhart
*Attorney, Agent, or Firm*—Young & Thompson

[57] ABSTRACT

A method of fabricating semiconductor devices which satisfactorily removes native oxide films and damaged layers which are formed on the surfaces of the conductor layers in the silicon substrates when contact holes are opened, and which tend to increase the contact resistances. A thin oxide film 5 is formed on the surface of a conductor region 3 in a silicon substrate 1 which is exposed at the bottom of the contact hole, and the oxide film 5 is then etched off with hydrogen-containing plasma. The native oxide film and/or damaged layer 3a, and the etching residue on the surface of the conduct layer 3 are satisfactorily removed, thus allowing provision of a contact structure with a low contact resistance regardless of whether the conductor type is P or N, without increasing the diameter of the contact hole.

13 Claims, 5 Drawing Sheets

METHOD OF FABRICATING SEMICONDUCTOR DEVICES WITH CONTACT HOLES

BACKGROUND OF THE INVENTION

1. Field of the Invention

The present invention relates to a method of fabricating semiconductor devices, and more specifically to a method of fabricating semiconductor devices with contact hole structures formed in insulating films for electrically connecting electrodes constructed of refractory metals or other like conductive material to diffusion layers provided in semiconductor substrates.

2. Conventional Art

FIG. 6 is a cross sectional view illustrative of an example of a conventional method of forming electrodes via contact holes. As illustrated in FIG. 6(a), a LOCOS oxide film 22 is formed on a silicon substrate 21 by conventional lithography and selective oxidation. Ions of boron difluoride are then implanted at 70 KeV with a dose of $5 \times 10^{15}$ cm$^{-2}$, and this is followed by activation treatment (annealing) at 900° C. to form a conductor region 23. Such conductor regions are often called diffusion regions as well. An interlayer dielectric film 24 is formed on the conductor region 23 to a height of 1.5 μm, for example, and a contact hole is formed by conventional photolithography using an i-line exposure combined with dry etching. When the contact hole is formed, a native oxide film 23a is formed on the surface of the conductor region 23 and elsewhere as illustrated in FIG. 6(a). This native oxide film 23a is then etched off to a depth of 5 nm, for example, with 1 (vol.) % hydrofluoric acid or the like, thus substantially removing the oxide 23a as illustrated in FIG. 6(b).

Thereafter, as illustrated in FIG. 6(c), titanium (Ti) 25 is deposited as the contact metal for forming an ohmic contact on the bottom of the contact hole by sputtering in a vacuum or by Chemical Vapor Deposition (LPCVD), to a height of 10 nm. Then, a 50 nm-thick film of titanium nitride 26 is formed on the titanium 25 to improve the barrier properties against the aluminum wiring to be formed thereon. Then, as illustrated in FIG. 6(d), aluminum 27 is formed thereon by sputtering, and each of the foregoing films is patterned by lithography as required. Here, as a preparation to wiring, the hole may be filled with tungsten (W) metal prior to the formation of the aluminum 27 especially when the contact hole has a high aspect ratio.

With the fabricating method of this conventional art, however, when the contact hole diameter is decreased with the downsizing of the device elements, and with the increase in integration, pretreatment with diluted hydrofluoric acid before the formation of a contact metal after the contact hole has been opened poses a problem. That is, since this diluted hydrofluoric acid etching is an isotropic etching with a low etching selectivity ratio of the native oxide film 23a to the interlayer dielectric film 24 made of silicon oxide or the like, the portion of the interlayer dielectric film 24 which forms the sidewall of the contact hole is undesirably etched off, as indicated by broken lines in FIG. 6(a), thus presenting the problem of undesirably large aperture. This not only prevents the pursuit of downsizing and integration, but also causes wiring shortage and junction leakage, resulting in a lower degree of device reliability.

In addition, according to the method of the conventional art, in cases where the conductor region is a P$^+$ diffusion layer, the native oxide film and/or the etching residue on the surface thereof cannot be removed to a satisfactory degree, and this presents a problem in that the contact resistance of the P$^+$ diffusion layer cannot be as low as that of the N$^+$ diffusion layer. This problem becomes more significant as the bottom of the contact has a smaller area and as the PN junction has a shallower depth, thus lowering the reliability of the device and preventing provision of higher-speed circuits.

In order to overcome such problems, it has been proposed to add pretreatment with a plasma of argon, hydrogen or a mixture of these gases just before the formation of the electrode. Results of investigations on contact resistivity characteristics by use of electron-cyclotron-resonance plasma enhanced chemical vapor deposition (ECR-CVD) are reported in the Technical Report of the IEBICE (the Institute of Electronics, Information and Communication Engineers), Vol. 92, No. 344, 61–66, 1992 (published in Japanese). According to the report, an N$^+$ or P$^+$ diffusion layer is formed on a silicon substrate, and a BPSG film is deposited on the diffusion layer, a contact hole with an aperture of 0.5 to 1.0 μm and an aspect ratio of 1.7 to 4.0 is then formed in the BPSG film. The substrate is then treated with diluted hydrofluoric acid in order to remove the native oxide film, followed by exposure to ECR plasma of argon and hydrogen, which is then followed by ECR-CVD to form a 30 nm-thick Ti film and a 100 nm-thick TiN film. Here, the substrate is heated to 420° C., and the reaction pressure is 1 mTorr. After the Ti and TiN films are formed, the substrate is subjected to thermal treatment in an atmosphere of nitrogen at 760° C. for 30 seconds, the contact hole is then buried by blanket tungsten CVD and a successive etch back process. Finally, aluminum wiring is formed, and the contact resistance was measured. According to the reported results, contact resistances on the N$^+$ diffusion layer and on the P$^+$ diffusion layer are not very different from each other when the aperture of the contact is as large as 0.7 μm, whereas the N$^+$ contact and the P$^+$ contact have apparently different resistances when the aperture of the contact is 0.6 μm or smaller.

Close examinations made by the present inventors on much more fine dimension contact holes with depths of 2.1 μm and apertures of up to 0.35 μm have revealed that the N$^+$ contact and the P$^+$ contact have increasingly different resistances as the aperture width decreases, as shown in FIG. 7. Further study by the present inventors has revealed that according to the reported method, only a same degree of effect as when the treatment is only with hydrofluoric acid was being produced, as shown in FIG. 8.

Recently, it has been suggested to add an Ar ECR plasma pretreatment to the wet treatment using hydrofluoric acid. Referring to abstract number 29p-K-18 (page 736) of the Extended Abstracts of the 42nd Spring Meeting (1995) of the Japan Society of Applied Physics and Related Societies, for example, the use of Ar ECR plasma results in a lower resistance on the P$^+$ diffusion layer than according to the wet treatment. However, the contact resistance value is still a few times larger than that of the value on the N$^+$ diffusion layer, and thus the reported method cannot prevent impairment of the device characteristics.

As mentioned above, according to the conventional method using wet pretreatment, since the etching is isotropic and etching selectivity ratio of the native oxide film on the bottom of the contact hole to the interlayer dielectric film made of silicon oxide or the like is low, the etching of the native oxide film leads to etching of the sidewall of the contact hole as well, thus increasing the aperture, as illustrated in FIG. 6. This tends not only to prevent the downsizing and the integration, but also to cause wire shorts and leakage through the junction, and thus the reliability is impaired. Also, since all the reported methods fail to satisfactorily remove the native oxide film, etching residue, etc. on the P+ diffusion layer, there is presented a problem in that the contact resistance on the P+ diffusion layer cannot be as low as on the N+ diffusion layer. This can be another reason for poorer electric characteristics of the device.

SUMMARY OF THE INVENTION

It is, therefore, an object of the present invention to provide a method of fabricating semiconductor devices with contact hole structures which are designed to have stable electric characteristics by lowering the contact resistances on the P+ diffusion layers even when the contact hole dimensions are reduced.

It is another object of the present invention to provide a method of fabricating semiconductor devices with contact hole structures which are designed to be performed in situ in a single vacuum apparatus, thus eliminating growth of native oxides to achieve faster processing leading to high throughput.

The fabricating method according to the present invention is characterized by comprising the steps of forming a conductor layer on the main surface of a semiconductor substrate, forming a contact hole to expose the conductor layer, forming a thin oxide film on the exposed surface of the conductor layer, removing the oxide film with plasma which contains at least hydrogen, and filling the contact hole with a metal to complete a contact hole structure.

Here, preferably plasma of argon and hydrogen is used to remove the oxide film. Also, preferably the treatment from the oxide film removing step to the metal filling step is carried out in the same processing equipment. Another characteristic aspect of the invention resides in that the metal filling step employs a selective CVD growth method.

BRIEF DESCRIPTION OF THE DRAWINGS

The above and other objects advantages and features of the present invention will be more apparent from the following description taken in conjunction with the accompanying drawings in which.

DETAILED DESCRIPTION OF THE PREFERRED EMBODIMENTS

Embodiments of the present invention will now be explained with reference to the drawings.

(Embodiment 1)

Figure 1A:
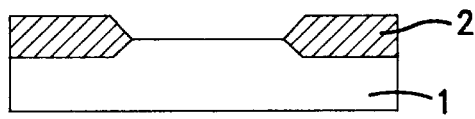
FIG. 1(a) to FIG. 1(d) are a first group of cross sectional views illustrative of a first embodiment of the present invention, following the steps thereof.
Figure 1B:
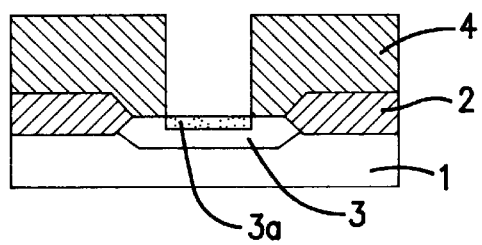
Figure 1C:
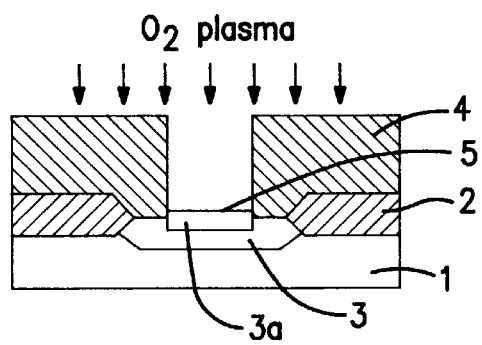

FIG. 1(a) to FIG. 1(d) and FIG. 2(a) to FIG. 2(c) are cross sectional views illustrative of a first embodiment of the method of fabricating semiconductor devices according to the present invention, following the steps thereof. As shown in FIG. 1(a), a LOCOS oxide film 2 is first formed on a silicon substrate 1 by conventional lithography and selective local oxidation. Then, as shown in FIG. 1(b), ions of boron difluoride are implanted at 70 KeV and with a dose of $5 \times 10^{15}$ cm$^{-2}$, which is followed by annealing at 900° C. for carrier activation, thereby forming a P+-type conductor layer 3. Next, an interlayer dielectric film 4 is then formed to a thickness of 1.5 μm, and a contact hole is formed by conventional lithography and dry etching. At this stage of the process, a damage layer and a native oxide film 3a induced by the ion implantation-annealing processes are formed on the surface of the conductor region 3. Thereafter, as illustrated in FIG. 1(c), an silicon oxide film 5 with a thickness on the order of 2 to 4 nm is formed on the bottom of the contact hole, that is, on the surface of the conductor region 3, by oxygen plasma treatment, for example. Although the treatment is accomplished with oxygen plasma, any of the dry methods which allow formation of a thin oxide film may be utilized. Also, oxides may be formed on the inner sidewalls of the contact hole as well, but only to add more oxygen to the already existent interlayer insulating dielectric film which is often a kind of silicon oxide.

Figure 1D:
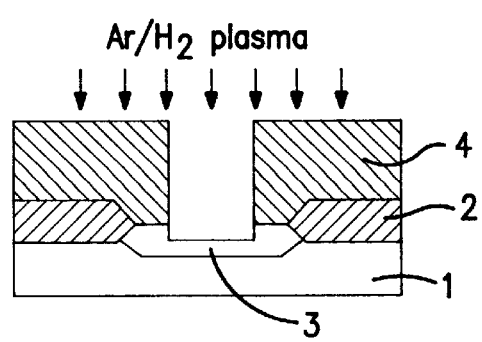

Then, as illustrated in FIG. 1(d), the semiconductor substrate thus processed is heated to approximately 300° C. in a processing chamber holding a plasma of a mixture of argon and hydrogen gas, thereby etching the oxide film 5 and the surface of the conductor region 3 to a depth of 2–10 nm. The processing chamber is maintained under a vacuum of 0.8 Torr while flowing 290 sccm of argon and 100 sccm of hydrogen with the active plasma of the mixed gas being generated by, for example ECR. The semiconductor substrate is then transferred to a CVD chamber. When the transfer is effected in vacuo, i.e., in a vacuum of sufficiently low pressure and in a sufficiently short time, reproduction of native oxide on the etched region is prevented.

Figure 2A:
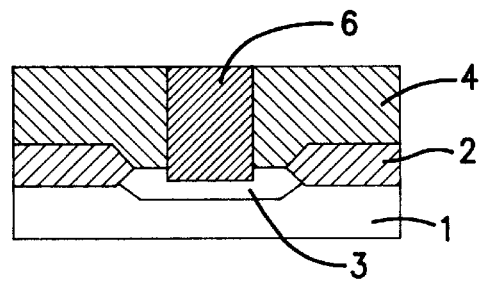
FIG. 2(a) to FIG. 2(c) are a second group of cross sectional views illustrative of the first embodiment of the present invention, following the steps thereof.
Figure 2B:
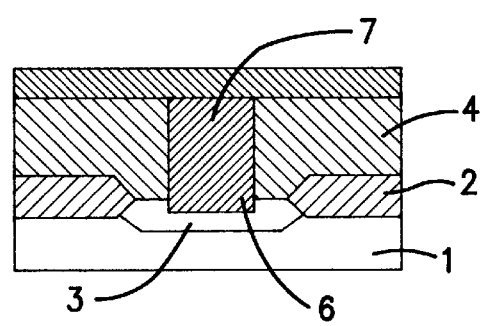
Figure 2C:
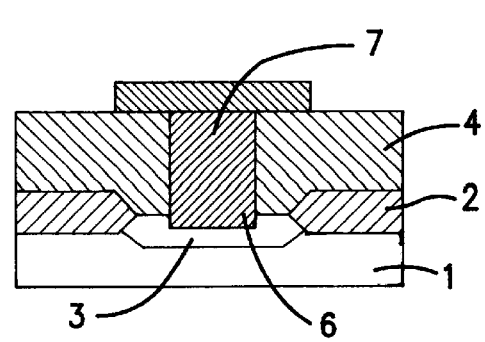

Thereafter, as illustrated in FIG. 2(a), CVD growth of tungsten (W) is performed on the substrate using 20 sccm of tungsten hexafluoride (WF$_6$) and 12 sccm of silane at a substrate temperature of 30° C. in the chamber maintained under a vacuum of 50 mTorr. By growing for 2 min 30 s., tungsten (W) 6 is selectivity grown only in the contact hole to form a W plug. Thereafter, as illustrated in FIG. 2(b), aluminum 7 is deposited on the entire surface, and then patterned by conventional lithography to form a wiring layer, as illustrated in FIG. 2(c).

With the contact hole structure formed in the above described method, the native oxide film or damaged layer 3a formed during the contact hole opening process as well as any etching residues are removed by forming the oxide film 5 on the surface of the conductor region 3 and then "sacrificialy" etching it off with plasma containing hydrogen.

Further, since exposure to an atmosphere containing oxygen or moisture is prevented from the time of etching the oxide film 5 to the growth of the refractory metal in the contact hole, regrowth of a native oxide layer is prevented. In this way, it is possible to attain a contact resistance which is as low as that of an N+ diffusion layer even for the case where the conductor region 3 is a P+ diffusion layer, without increasing the diameter of the contact hole through an interlayer dielectric film 4.

Figure 3A:
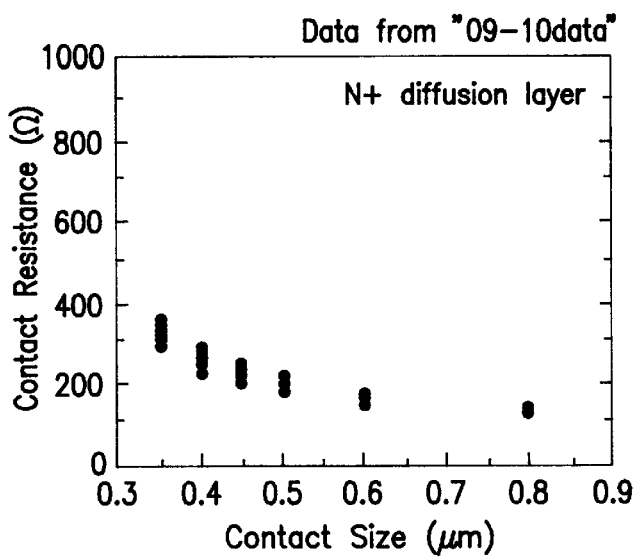
FIG. 3(a) and FIG. 3(b) shows graphs illustrating the contact resistances of contact holes formed by the method according to the present invention.
Figure 3B:
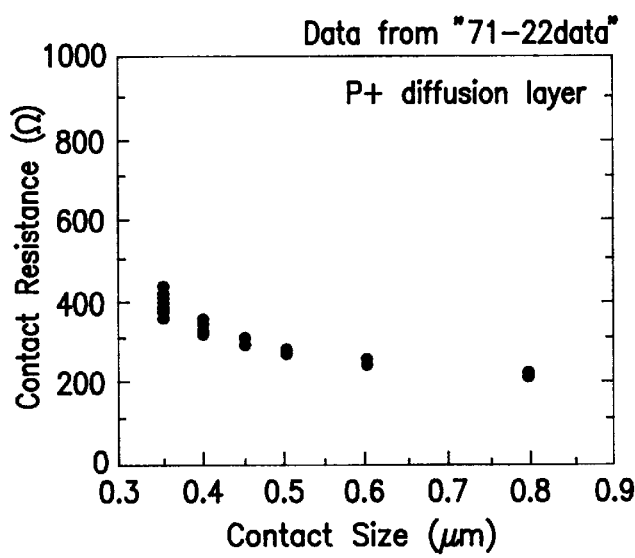
Figure 4A:
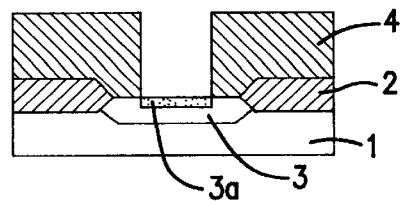
FIG. 4(a) to FIG. 4(d) are a first group of cross sectional views illustrative of a second embodiment of the present invention, following the steps thereof.
Figure 4B:
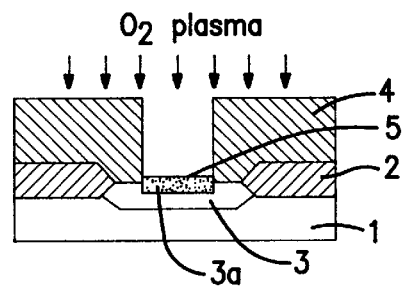
Figure 4C:
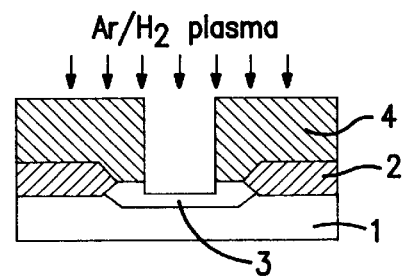
Figure 4D:
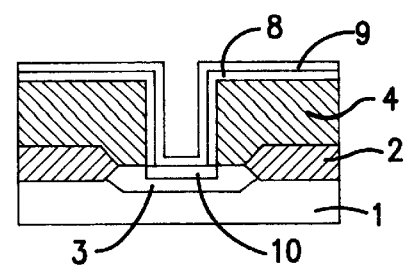
Figure 5A:
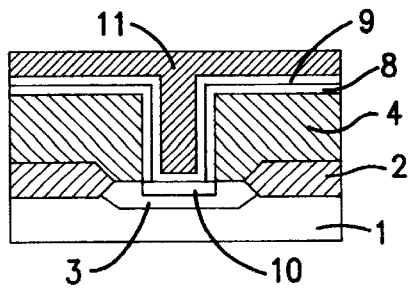
FIG. 5(a) to FIG. 5(d) are a second group of cross sectional views illustrative of the second embodiment of the present invention, following the steps thereof.
Figure 5B:
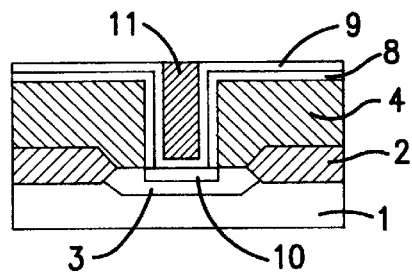
Figure 5C:
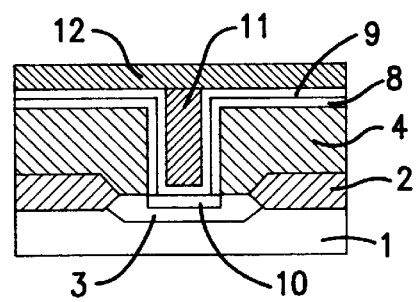
Figure 5D:
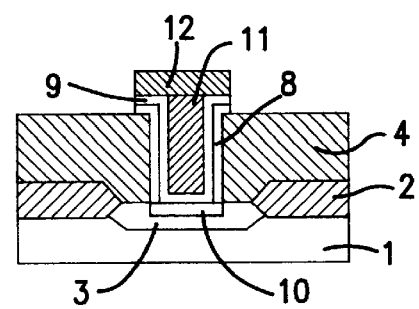
Figure 6A:
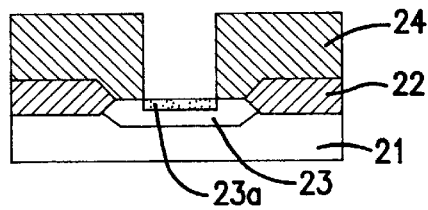
FIG. 6(a) to FIG. 6(d) are a group of cross sectional views illustrative of a fabricating method of the conventional art, following the steps thereof.
Figure 6B:
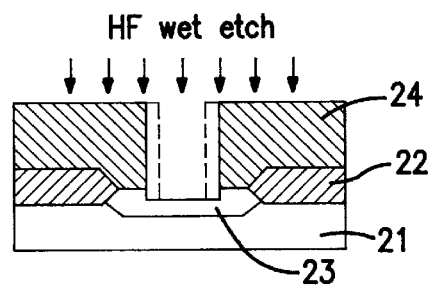
Figure 6C:
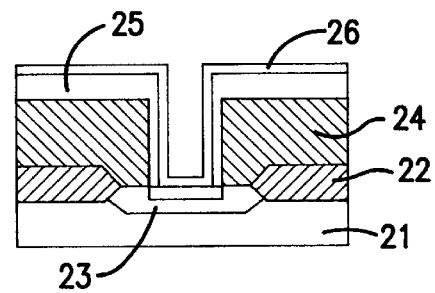
Figure 6D:
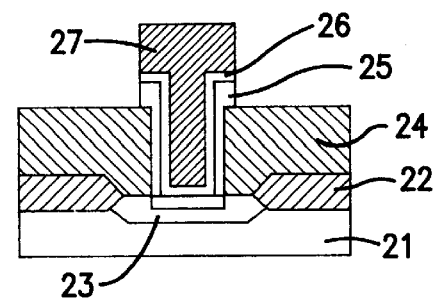
Figure 7A:
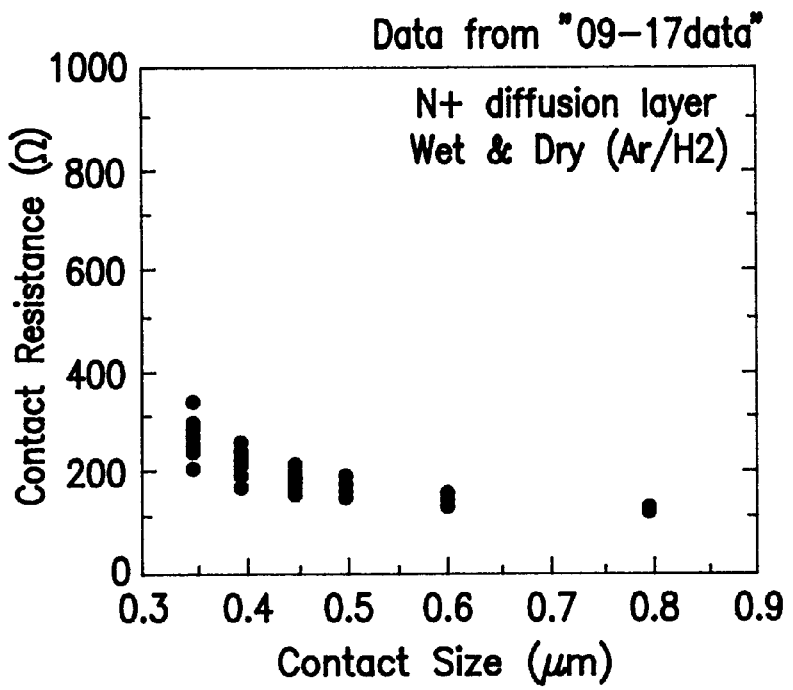
FIG. 7(a) and FIG. 7(b) shows graphs illustrating the contact resistances of contact holes fabricated by the method of the conventional art; and FIG. 8(a)
Figure 7B:
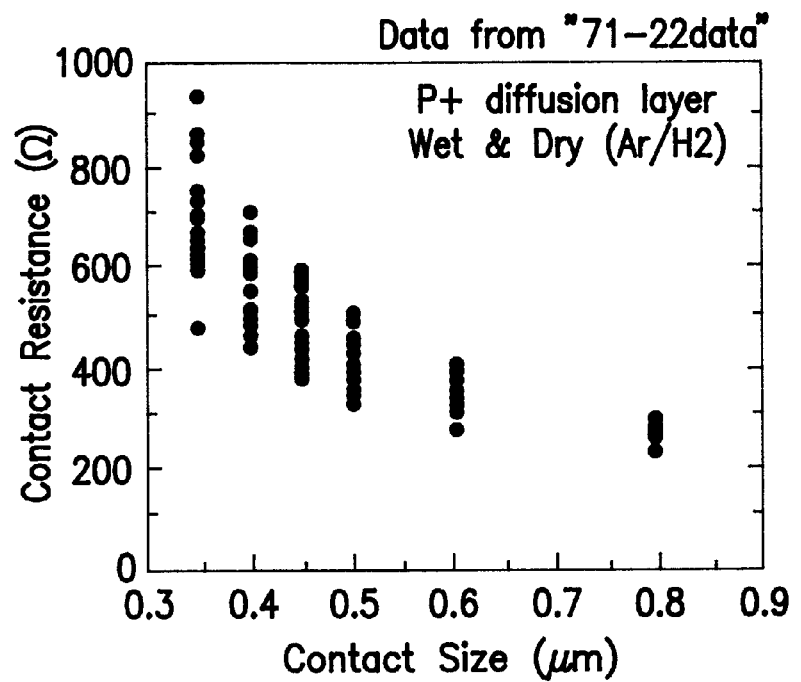
Figure 8A:
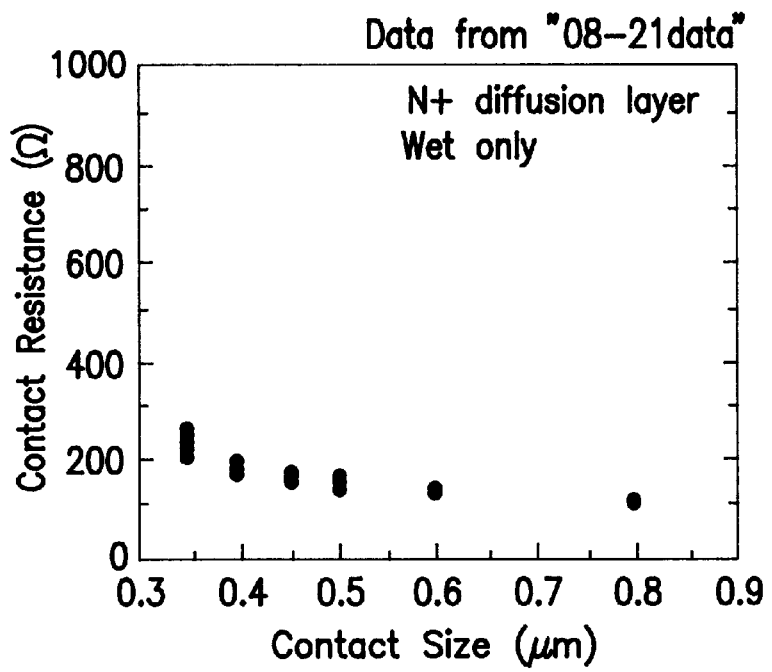
FIG. 8(b) shows graphs illustrating the contact resistances of contact holes fabricated by an improved method of the conventional art.
Figure 8B:
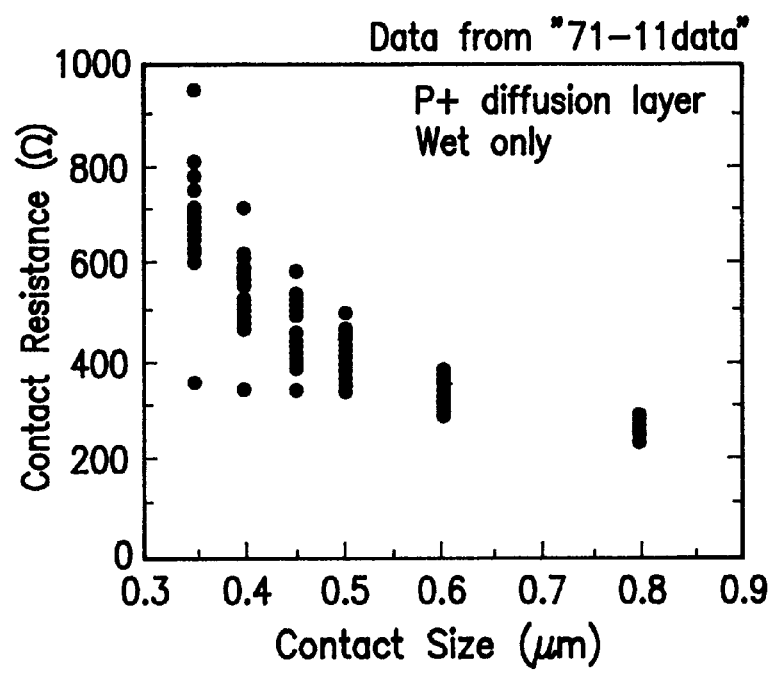

For example, as illustrated in FIG. 3(*a*) and FIG. 3(*b*) which show, respectively, the contact resistances of the N$^+$ diffusion layer and the P$^+$ diffusion layer produced according to the present embodiment, it has been confirmed that the contact resistances little differ from each other even in cases where the contact hole diameter is minute.

Although the tungsten 6 was formed after the oxide film 5 had been etched off according to the present embodiment, more stable electric characteristics are acquired by performing the ion implantation of boron difluoride after the oxide film 5 etching in cases where the junction of the semiconductor device has a shallow depth. In addition, although the etching of the bottom of the contact hole and the formation of the metal film were carried out in separate chambers according to the present embodiment, the throughput may be increased by carrying them out in a same chamber.

(Embodiment 2)

A second embodiment of the present invention will now be explained with reference to the drawings. FIG. 4(*a*) to FIG. 4(*d*) and FIG. 5(*a*) to FIG. 5(*d*) are cross sectional views illustrative of the second embodiment, following the steps thereof.

As shown in FIG. 4(*a*), a LOCOS oxide film 2 is first formed on a silicon substrate 1 by conventional lithography and selective local oxidation. Then, ions of boron difluoride are implanted at 70 KeV and with a dose of $5 \times 10^{15}$ cm$^{-2}$, which is followed by annealing at 900° C. for carrier activation, thereby forming a P$^+$-type conductor layer 3. Next, an interlayer dielectric film 4 is then formed to a thickness of 1.5 μm, and a contact hole is formed by conventional lithography and dry etching. At this stage of the process, a damage layer and a native oxide film 3*a* induced by the ion implantation-annealing processes are formed on the surface of the conductor region 3. Thereafter, as illustrated in FIG. 4(*b*), an oxide film 5 with a thickness on the order of 2–4 nm is formed on the conductor region 3, by treatment with oxygen plasma. Although the treatment is accomplished with oxygen plasma, any of the dry methods which allow formation of a thin oxide film may be utilized. The oxide film 5 may be formed by CVD or the like as well. Also, oxides may be formed on the inner sidewalls of the contact hole as well, but only to add more oxygen to the already existent interlayer insulating dielectric film which is often a kind of silicon oxide.

The following steps are then carried out in a vacuum camber without performing the conventional wet treatment. Specifically, as illustrated in FIG. 4(*c*), the substrate 1 is heated to approximately 600° C. in a processing chamber holding a plasma of a mixture of argon and hydrogen gas, thereby etching the oxide film 5 and the surface of the conductor region 3 to a depth of 2–10 nm. The processing chamber is maintained under a vacuum of 0.8 Torr while flowing 290 sccm of argon and 100 sccm of hydrogen with the active plasma of the mixed gas being generated by, for example ECR. Since the etching rate of the oxide film is 4 nm/min under these conditions, easy-to-control anisotropic etching may be applied to a shallow diffusion layer. As illustrated in FIG. 4(*d*), a 10 nm-thick film of titanium (Ti) 8, and a 50 nm-thick film of titanium nitride (TiN) 9 are sequentially deposited on the entire surface of the substrate. The Ti film 8 is formed by, for example, plasma CVD which involves heating of the silicon substrate 1 to 600° C. in a hydrogen/titanium tetrachloride plasma atmosphere. The TiN film 9 is formed in the same plasma CVD apparatus using the plasma with nitrogen added thereto. The substrate 1 is then heated by rapid thermal annealing to selectively form a silicide 10 with the silicon substrate 1. However, the rapid thermal annealing of titanium is not absolutely necessary, since silicide could be formed at the CVD temperature as well. The process from the pretreatment to the TiN formation may be carried out in the same CVD chamber.

Thereafter, by adjusting the substrate temperature to 400° C., and depositing tungsten 11 on the entire surface by the already described CVD method, the contact hole is filled in with the tungsten 11, as illustrated in FIG. 5(*a*). Then, as illustrated in FIG. 5(*b*), the tungsten 11 is etched back to be left only in the contact hole. Then, as illustrated in FIG. 5(*c*), aluminum 12 is deposited on the entire surface by sputtering or the like, and patterned as a wiring layer by lithography, as illustrated in FIG. 5(*d*).

According to the second embodiment as well, in the same manner as the first embodiment, etching off of the thin oxide film 5 formed on the surface of the conductor region 3 by the hydrogen containing plasma allows removal of the native oxide film and the damage layer 3*a* produced on the surface of the conductor region 3, and simultaneous removal of the etching residue, and this allows a lower contact resistance of the conductor region 3 even in cases where it is constructed as a P$^+$ diffusion layer.

Here, although the titanium 8 and the titanium nitride 9 were rapidly heated after both have been deposited, the rapid heating may be effected after deposition of only the titanium 8. In addition, the tungsten 11, though being etched according to the present embodiment, may be directly patterned.

As explained above, according to the present invention, since the treatment with plasma containing hydrogen is effected after formation of a tin oxide film on the surface of the conductor layer in the contact hole, the native oxide film and the etching residue on the substrate surface may be removed in a controlled manner even when the conductor layer is a P$^+$ diffusion layer, and thus the P$^+$ diffusion layer has as low a contact resistance as an N$^+$ diffusion layer. In other words, a miniaturized contact hole with a low contact resistance may be fabricated without increasing its diameter. In addition, since the process from the treatment with plasma to the metal filling step may be carried out in the same equipment, during which time no native oxide film is produced, this, when combined with a possible short-time pretreatment, may contribute to increase in the throughput.

While the present invention has been described in connection with certain preferred embodiments, it is to be understood that the subject matter encompassed by way of the present invention in not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of:

forming a conductor layer on a main surface of a semiconductor substrate;

forming an insulator film covering said conductor layer;

forming a contact hole in said insulator film to expose said conductor layer;

forming intentionally an oxide film on said exposed surface of said conductor layer with a plasma containing oxygen;

removing said oxide film using a plasma containing argon and hydrogen; and filling said contact hole with a conductive material.

2. The method of fabricating a semiconductor device as claimed in claim 1, wherein said conductor layer is a P-type impurity diffusion layer.

3. The method of fabricating a semiconductor devices as claimed in claim 1, wherein said conductive material is a refractory metal.

4. The method of fabricating a semiconductor device as claimed in claim 1, wherein said conductive material comprises tungsten.

5. The method of fabricating a semiconductor device as claimed in claim 1, wherein said step of filling said contact hole is by selective chemical vapor deposition.

6. The method of fabricating a semiconductor device as claimed in claim 1, wherein said step of removing said oxide film and said step of filling said contact hole are performed successively in a same plasma processing chamber.

7. The method of fabricating a semiconductor device as claimed in claim 1, wherein said step of removing said oxide film and said step of filling said contact hole are performed successively without exposing said semiconductor substrate to an atmosphere containing oxygen.

8. A method of fabricating a semiconductor device, comprising the steps of:

ion implanting impurity atoms to form an impurity diffusion layer on a main surface of a semiconductor substrate comprising silicon;

forming an insulative dielectric film covering said conductor layer;

forming a contact hole in said dielectric film to expose said conductor layer at a bottom of said contact hole;

oxidizing intentionally said conductor layer exposed at said bottom of said contact hole with a plasma containing oxygen;

removing an oxidized portion of said conductor layer exposed at said bottom of said contact hole using a plasma containing argon and hydrogen; and filling said contact hole with a conductive material.

9. The method of fabricating a semiconductor device as claimed in claim 8, wherein said step of oxidizing is performed without any pretreatment involving isotropic etching.

10. The method of fabricating a semiconductor device as claimed in claim 8, wherein said conductor layer is a P-type impurity diffusion layer.

11. The method of fabricating a semiconductor devices as claimed in claim 8, wherein said conductive material is a refractory metal.

12. The method of fabricating a semiconductor device as claimed in claim 8, wherein said step of removing said oxidized portion and said step of filling said contact hole are performed successively in a same plasma processing chamber.

13. The method of fabricating a semiconductor device as claimed in claim 8, wherein said step of removing said oxided portion and said step of filling said contact hole are performed successively without exposing said semiconductor substrate to an atmosphere containing oxygen.

* * * * *